United States Patent [19]
Yoo et al.

[11] Patent Number: 6,054,368
[45] Date of Patent: Apr. 25, 2000

[54] METHOD OF MAKING AN IMPROVED FIELD OXIDE ISOLATION STRUCTURE FOR SEMICONDUCTOR INTEGRATED CIRCUITS HAVING HIGHER FIELD OXIDE THRESHOLD VOLTAGES

[75] Inventors: Chue-San Yoo; Cheng-Yeh Shih, both of Hsin-Chu, Taiwan

[73] Assignee: Taiwan Semiconductor Manufacturing Company, Hsin-Chu, Taiwan

[21] Appl. No.: 08/884,914

[22] Filed: Jun. 30, 1997

[51] Int. Cl.[7] ................................. H01L 21/76
[52] U.S. Cl. ................. 438/450; 438/297; 438/452; 438/225; 257/395
[58] Field of Search .................... 438/225, 362, 438/439, 450, 452, 297; 257/395

[56] References Cited

U.S. PATENT DOCUMENTS

| | | | |
|---|---|---|---|
| 5,316,965 | 5/1994 | Philipossian et al. | 437/70 |
| 5,393,677 | 2/1995 | Lien et al. | 438/439 |
| 5,397,732 | 3/1995 | Chen | 437/69 |
| 5,672,538 | 9/1997 | Liaw et al. | 438/225 |
| 5,686,346 | 3/1996 | Duane | 438/225 |
| 5,728,614 | 3/1998 | Tseng | 438/225 |
| 5,858,860 | 2/1997 | Shim et al. | 438/439 |
| 5,895,257 | 8/1996 | Tsai et al. | 438/297 |

*Primary Examiner*—Charles Bowers
*Assistant Examiner*—David S Blum
*Attorney, Agent, or Firm*—George O. Saile; Stephen B. Ackerman

[57] ABSTRACT

A method and structure for forming a modified field oxide region having increased field oxide threshold voltages ($V_{th}$) and/or reduced leakage currents between adjacent device areas is achieved. The method involves forming a field oxide using the conventional local oxidation of silicon (LOCOS) using a patterned silicon nitride layer as a barrier to oxidation. After forming the LOCOS field oxide by thermal oxidation and removing the silicon nitride, a conformal insulating layer composed of silicon oxide is deposited and anisotropically etched back to form sidewall insulating portions over the bird's beak on the edge of the LOCOS field oxide, thereby forming a new modified field oxide. P-channel implants are formed in the device areas. Then a second implant is used to implant through the modified field oxide to provide channel-stop regions with modified profiles that increase the field oxide $V_{th}$ and/or reduce leakage current between device areas. This improved field oxide/channel-stop structure is particularly useful for reducing the leakage current on DRAM cells thereby increasing the refresh cycle times.

24 Claims, 2 Drawing Sheets

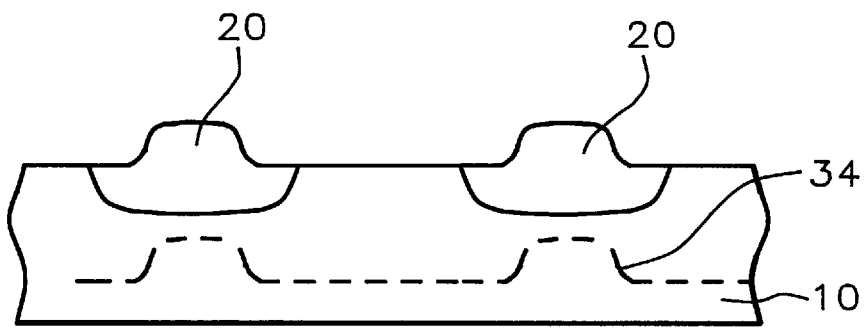
FIG. 1 - Prior Art
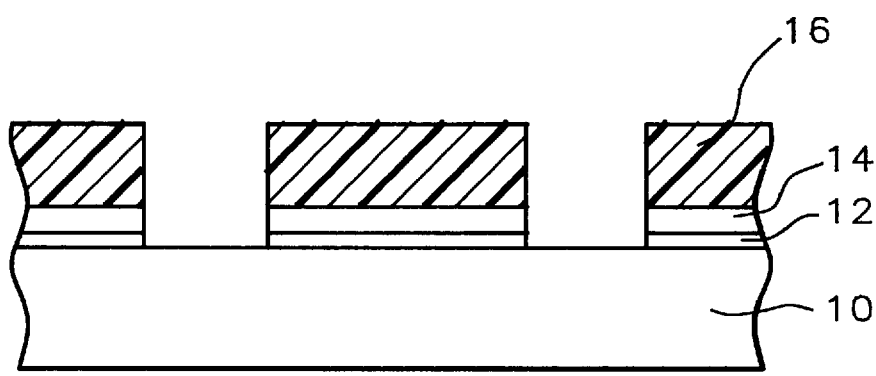
FIG. 2
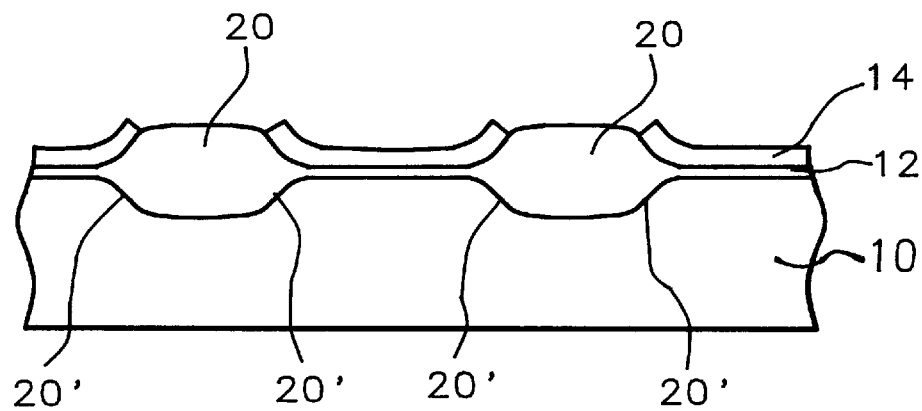
FIG. 3

METHOD OF MAKING AN IMPROVED FIELD OXIDE ISOLATION STRUCTURE FOR SEMICONDUCTOR INTEGRATED CIRCUITS HAVING HIGHER FIELD OXIDE THRESHOLD VOLTAGES

BACKGROUND OF THE INVENTION (1) Field of the Invention

The present invention relates in general to the fabrication of semiconductor devices for integrated circuits, and more particularly to a method for forming a modified field oxide (FOX) isolation that increases the field oxide threshold voltages ($V_{th}$) for a specific channel-stop implant dose under the FOX. Alternatively, the $V_{th}$ can be maintained at a constant value while the channel-stop implant dose can be reduced, which results in lower leakage currents between device areas. The method is particularly useful for dynamic random access memory (DRAM) for decreasing leakage currents and thereby increasing the refresh cycle times for storage capacitors.

(2) Description of the Prior Art

In the fabrication of semiconductor circuits, field oxide regions are formed in and on the silicon substrate (wafer) to surround and electrically isolate the device areas. One of the most common and cost-effective methods of forming this field oxide isolation in the semiconductor industry is by the LOCal Oxidation of Silicon (LOCOS) technique.

The LOCOS technique involves growing a pad oxide on the silicon substrate as a stress-release layer. A silicon nitride ($Si_3N_4$) layer that is a barrier layer to oxidation is deposited, typically by chemical vapor deposition (CVD). Conventional photolithographic techniques and plasma etching are then used to pattern the silicon nitride layer, leaving portions of the silicon nitride over the required device areas while exposing the silicon substrate in areas where the field oxide (FOX) isolation is required. By conventional methods, with the photoresist mask still in place, a P dopant (boron) is implanted in the field oxide areas to form channel-stop regions. The channel-stop regions prevent surface depletion or inversion at the field oxide/silicon substrate interface after the field oxide is formed by LOCOS, and prevent parasitic field oxide MOSFETs from turning on when the chip is powered up. The substrate is then subjected to a thermal oxidation to form the silicon oxide field oxide isolation regions having the channel-stop implants underneath. However, because of the high segregation coefficient for boron into the field oxide during the relatively long LOCOS oxidation cycle, higher implant doses are used to prevent inversion. Alternatively, to avoid the segregation, another method is to implant the boron ions through the field oxide after the LOCOS oxide is grown.

However, the LOCOS methods even with implanting through the field oxide, has several problems as the device feature sizes decrease and the circuit density increases. One problem is the lateral oxidation of the silicon substrate under the silicon nitride mask forming what are commonly referred to in the industry as "birds' beaks." These birds' beaks extend into and reduce the active device areas and are much thinner than the LOCOS FOX that is grown in the regions between the patterned $Si_3N_4$ layers. Also, as the width of the LOCOS between adjacent device areas decreases, the channel-stop implant through the field oxide becomes less effective, especially under the bird's beaks, and therefore requires a higher implant dose. However, this results in higher leakage currents that shorten the refresh cycle time and reduce the DRAM performance.

One method of reducing the bird's beak is by using a polysilicon buffer LOCOS, referred to as PBLOCOS. Another method for reducing the bird's beak is the use of a double silicon nitride layer and a polysilicon layer as described by Chen in U.S. Pat. No. 5,397,732. Another method for forming a planar field oxide without birds' beaks is described by Philipossian et al. in U.S. Pat. No. 5,316,965 but requires etching trenches in the silicon substrate in which the recessed trench isolation is fabricated. Typically these methods require more complex processing than the more conventional LOCOS technique.

However, one problem that arises when narrow field oxide regions are formed by the more conventional LOCOS method is that the birds' beaks formed under the silicon nitride layer are thinner than the main field oxide region and can result in lower field oxide parasitic threshold voltages ($V_{th}$) because of the deeper channel-stop region when the field implant is implanted through the birds' beaks. One method is to increase the implant dose, but this leads to increased junction leakage and would degrade circuit performance, such as on DRAMs.

However, there is still a need to improve upon the more conventional LOCOS process while maintaining narrow FOX regions with increased FOX threshold voltages ($V_{th}$) and minimizing the leakage current between adjacent device areas.

SUMMARY OF THE INVENTION

It is a principal object of this invention to provide a field oxide isolation region having higher threshold voltages and reduced leakage currents between adjacent device areas.

It is another object of this invention to provide these higher threshold voltages and reduced leakage currents by forming additional insulating sidewall portions along the perimeter of the field oxide regions which modify the channel-stop implant profile when the channel-stop implant dopant is implanted through the modified field oxide.

It is an object of this invention to provide a new structure and method for forming field oxide isolation regions by providing a modified LOCOS structure. The method consists of depositing a conformal insulating layer over the more conventional LOCOS field oxide, and anisotropically plasma etching back to form a thicker insulation over the perimeter of the LOCOS field oxide, commonly referred to as the "bird's beak". This modifies the profile of the channel-stop implant through the field oxide which provides a more robust isolation having increased field oxide threshold voltages ($V_{th}$) and reduced leakage currents.

In summary, the method of forming the field isolation structure begins by providing a semiconductor substrate, such as a single-crystal silicon. A silicon oxide layer is formed on the surface of the silicon substrate to provide a stress-release pad oxide layer. A silicon nitride layer is deposited on the pad oxide layer, which provides an oxidation barrier layer. The silicon nitride layer and the pad oxide layer are patterned to leave portions over the device areas, while providing openings over the areas surrounding the device areas where the field oxide isolation regions are required. The silicon substrate is then thermally oxidized in the openings, while the silicon nitride layer prevents oxidation of the device areas, thereby forming a field oxide that by the LOCOS method results in thinner portions, commonly referred to as "bird's beak" on the perimeter of the field oxide extending under the silicon nitride layer. The silicon nitride and pad oxide layers are removed by wet etching exposing the device areas. A sacrificial oxide layer is formed by thermal oxidation in the device areas and is then removed by wet etching to remove any surface damage. Now, by the method of this invention, the shape of the LOCOS field oxide is modified by depositing a conformal insulating layer, such as silicon oxide ($SiO_2$) deposited by chemical vapor deposition (CVD) on the substrate and over the LOCOS field oxide. The conformal insulating layer is anisotropically plasma etched back to the substrate leaving sidewall portions of the insulating layer on the thinner portions of the LOCOS field oxide, thereby modifying the shape of the field oxide by forming a thicker oxide layer over the bird's beak. As described later, this thicker oxide modifies the channel-stop implant profile, which increases the threshold voltages and/or reduces leakage currents, which eliminates the need for higher implant doses that are known to cause higher leakage currents. A thin oxide implant layer is formed on the device areas and a patterned photoresist implant mask is used to form P-wells by ion implantation, the channel-stop implant regions under the field oxide by implanting through the modified field oxide having the sidewall portions, and a deep implant to prevent latchup. The thicker field oxide at the perimeter resulting from the sidewall portions modifies the profile of the channel-stop implant in the substrate. This forms a channel-stop implant closer to the field oxide/substrate interface under the bird's beak, which results in increased threshold voltages and reduced leakage currents. Also, the thicker field oxide further increases the threshold voltage.

BRIEF DESCRIPTION OF THE DRAWINGS

The objects and other advantages of this invention are best understood in the preferred embodiment with reference to the attached drawings that include:

FIG. 1 is a schematic cross-sectional view showing a conventional field oxide formed by the prior art using the LOCOS technique and showing the field implant (channel-stop implant) through the field oxide.

FIGS. 2 through 5 are a series of cross-sectional views, by the method of this invention, for the modified LOCOS field oxide which results in the field implant (channel-stop implant) being closer to the silicon substrate/field oxide interface.

DESCRIPTION OF THE PREFERRED EMBODIMENT

Figure 4:
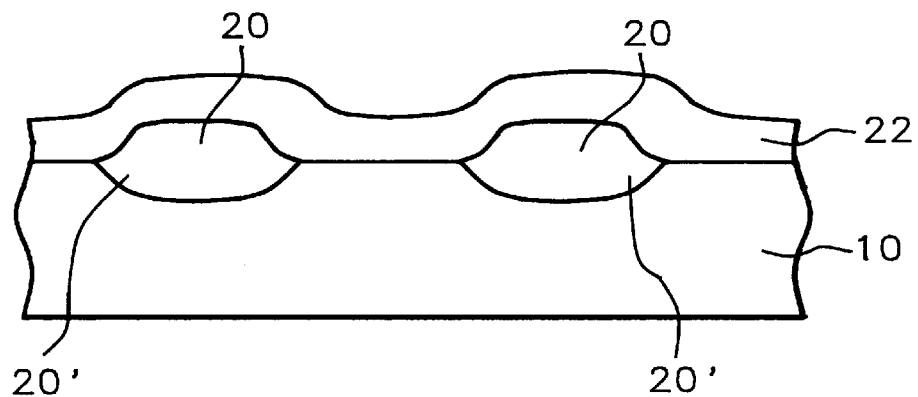

The method of this invention is now described in detail for forming the modified LOCOS field oxide with increased field threshold voltage ($V_{th}$). Although only a portion of the substrate is depicted in the Figs. showing the formation of only two field oxide regions, it should be well understood by one skilled in the art that a multitude of field oxide regions can be formed concurrently on a P-doped silicon substrate, and more particularly the modified field oxide can be formed on P- silicon substrates having both P and N wells in and on which both N-channel and P-channel field effect transistors (FETs) and other devices can be built, such as CMOS peripheral circuits on DRAM chips Referring now to FIG. 2, the method for forming the modified field oxide starts by forming a stress-release pad oxide 12 on the single crystal silicon substrate 10. The pad oxide layer 12 is formed by thermally oxidizing the substrate in a dry or wet oxygen ambient at a temperature of between about 850 and 1100° C. for about 90 to 360 minutes. The thickness of the pad oxide is between about 50 and 200 Angstroms.

A silicon nitride layer 14 is then deposited on the pad oxide 12 to form the oxidation barrier layer for the LOCOS process. The silicon nitride layer 14 is deposited by chemical vapor deposition (CVD) using, for example, a reactant gas mixture of silane ($SiH_4$) and ammonia ($NH_3$), and preferably is deposited to a thickness of between about 1200 and 1800 Angstroms.

Referring still to FIG. 2, a photoresist mask 16 is used to pattern the silicon nitride layer 14 and the pad oxide layer 12, leaving portions over areas where field oxides are not desired, and more specifically over the device areas. Anisotropic plasma etching is used to etch openings in the silicon nitride layer 14 that surround the device areas where the field oxide isolation regions are required. Preferably layer 14 is etched using reactive ion etching (RIE) or high-density plasma (HDP) etching using an etchant gas such as trifluoromethane ($CHF_3$), and the photoresist mask 16 is removed by plasma ashing in oxygen ($O_2$).

Referring now to FIG. 3, the field oxide isolation regions 20 are formed. This is achieved by exposing the substrate to an oxidizing ambient such as a steam oxidation, as is well known in the prior art. For example, the oxidation can be carried out at a temperature of between about 850 and 1100° C. for between about 90 and 360 minutes. The field oxide 20 is grown to a thickness of between about 3000 and 5000 Angstroms. As shown in FIG. 3, the portions 20' of the field oxide 20 that grows laterally under the silicon nitride layer 14 is considerably thinner than the field oxide in the open areas of the silicon nitride layer. These thinner portions 20' are commonly referred to as "birds' beaks" in the industry. The silicon nitride layer 14 and the pad oxide layer 12 are removed, respectively, by wet etching in hot phosphoric acid ($H_3PO_4$) and in a dilute solution of hydrofluoric (HF) acid and water. A sacrificial oxide layer of about 250 Angstroms is then formed by thermal oxidation on the device areas, and is removed by wet etching in a dilute HF solution to remove any contaminants or surface damage resulting from earlier processing steps.

Referring now to FIG. 4 and more specifically to the method of this invention, a conformal insulating layer 22 is deposited over the field oxide 20 and over the device areas. Preferably layer 22 is a CVD silicon oxide. For example, the CVD oxide can be deposited by low pressure CVD using tetraethosiloxane (TEOS) at a temperature of between about 650 and 800° C. The thickness of insulating layer 22 is preferably between about 1000 and 2000 Angstroms.

Figure 5:
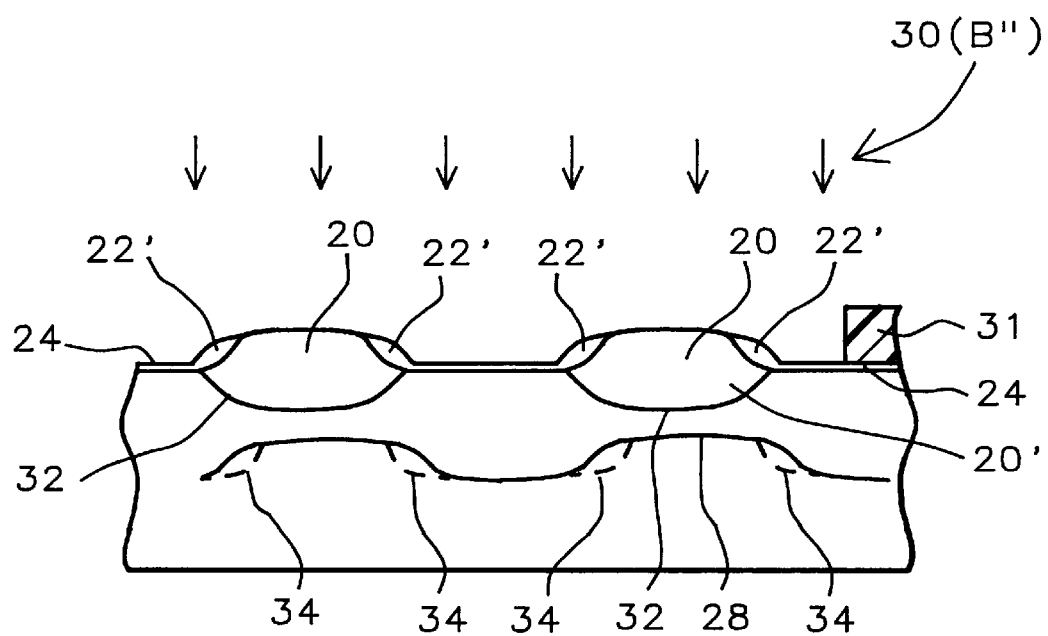

Referring next to FIG. 5, anisotropic plasma etching is used to etch back the insulating layer 22 to the substrate surface leaving sidewall portions 22' of the insulating layer 22 over the thin portions (birds' beaks) 20'. This substantially modifies the shape of the field oxide 20 and, as will be seen later, alters the profile of the field implant (channel-stop implant) which increases the field oxide threshold voltage ($V_{th}$).

Still referring to FIG. 5, a sacrificial oxide layer 24 is grown on the exposed device areas by carrying out a dry oxidation in an oxygen furnace. Layer 24 is grown to a preferred thickness of between 100 and 300 Angstroms, and more specifically to a thickness of 110 Angstroms. This serves as an implant buffer layer that prevents metal contamination during implant and also reduces undesirable channeling effects during ion implantation.

Referring still to FIG. 5, a series of P-dopant implants is now carried out to form the P-wells, the field implant (channel-stop implant), and a deep implant using a single P-well implant photoresist mask 31. The photoresist mask is used to prevent implanting in regions where the P implant is not desired, such as in the N-well regions and other areas on the chip. The P-channel and N-channel FETs that make up the CMOS circuits, such as peripheral circuits on DRAMs, are susceptible to latchup which can cause the circuit to malfunction, or worse can destroy the circuit. Therefore, a deep implant is used to prevent parasitic pnpn structures from turning on in the CMOS and causing latchup.

Continuing with the process, the P-well is now formed in the substrate 10 by ion implanting boron ($B^{11}$) through the sacrificial oxide layer 24 in the device areas. The $B^{11}$ implant is preferably carried out at a dose of between about 1.0 E 12 and 1.0 E 14 atoms/cm$^2$ and at an ion energy of between about 60 and 180 KeV. The P-well implant profile is not explicitly shown in FIG. 5 to simplify the drawing and to more clearly show the improved effect of the modified field oxide composed of layers 22 and 22') on the P-field implant which is carried out next.

Still referring to FIG. 5, and more specific to the invention, the P-field implant 30 (as depicted by the vertical arrows) is used to form the channel-stop implant regions 28 in the substrate 10 under the modified field oxide (20 and 22'). The preferred P-field ion implant energy are selected so the projection range (Rp) of the ions (the distance at which the maximum concentration is achieved) is in the substrate 10 near the substrate/modified field oxide interface 32. Now to better appreciate the invention, the implant profile through the more conventional LOCOS field oxide 20 without the sidewall portions 22' is also depicted in FIG. 5 by the dashed lines 34. Since the Rp for conventional channel-stop profile 34 is deeper at the edges of the field oxide, the channel length is short. This results in an undesirable lower threshold voltage ($V_{th}$) that can turn on the parasitic field oxide MOSFET resulting from metal or polysilicon lines over the field oxide when the circuit is powered up. Alternatively if the channel-stop ion implant dose is increased in the conventional LOCOS field oxide, then the leakage current also increases. This high leakage current is particularly undesirable on DRAM memory cells since the refresh cycle time is reduced and circuit performance is degraded. By way of example only, if the field oxide is grown to a thickness of between about 3000 and 5000 Angstroms, then the field implant is carried out using a boron ($B^{11}$) implantation at an implant dose of between about 2.0 E 12 and 1.0 E 13 atoms/cm$^2$ and at an implant energy of between about 60 and 180 KeV.

To better appreciate the advantages of the modified field oxide having the sidewall insulating portions 22', an example is provided comparing the threshold voltages ($V_{th}$) of this modified field oxide to the more conventional LOCOS field oxide shown in the prior art in FIG. 1. The prior art conventional field oxide 20 formed by LOCOS and shown in FIG. 1 is formed on the substrate 10, having a conventional P-field implant 34 as depicted by the dashed line.

EXAMPLE

Silicon substrates were processed having DRAM cells with the conventional LOCOS process, as shown by the prior art of FIG. 1, and the modified field oxide, as shown in FIG. 5. Both field oxides were grown to a thickness of 2600 Angstroms. After forming the sidewall insulating portions 22' to form the modified field oxide (FIG. 5), both field oxide structures were implanted with boron at a dose of 4.5 E 12 ions/cm$^2$. The threshold voltage ($V_{th}$) of both field oxide structures was measured by forming a gate electrode over the field oxides between adjacent device areas, which serves as the source/drain areas for this field oxide MOSFET. The threshold voltages were determined by measuring the source/drain current as a function of the gate voltage. The conventional field oxide had a $V_{th}$ of 8.21 volts, and the modified field oxide had a $V_{th}$ greater than 10 volts, which is an improvement of at least 22% This clearly demonstrates the improved $V_{th}$ for the modified field oxide over the more conventional field oxide. Alternatively, the field implant dose can be reduced to maintain a $V_{th}$ of about 8.21 volts on the modified field oxide, thereby allowing for lower leakage currents and improved refresh cycle times for DRAM cells.

While the invention has been particularly shown and described with reference to the preferred embodiment thereof, it will be understood by those skilled in the art that various changes in form and details may be made without departing from the spirit and scope of the invention. Although the method is particularly useful for improving DRAM cells, it should also be well understood that the method and the structure can be applied to other VLSI and ULSI integrated circuits to increase the $V_{th}$, and/or to reduce leakage currents.

What is claimed is:

1. A method of forming modified field oxide isolation regions on the surface of a silicon substrate with increased threshold voltages and reduced leakage currents, comprising the steps of:

forming a silicon oxide layer on said surface of said silicon substrate thereby forming a pad oxide layer;

depositing a silicon nitride layer on said pad oxide layer thereby providing an oxidation barrier layer;

patterning said silicon nitride layer and said pad oxide layer and leaving portions over device areas while providing openings in said silicon nitride layer that surround said device areas where said field oxide isolation regions are required;

thermally oxidizing said silicon substrate in said openings while said silicon nitride layer prevents oxidation of said device areas thereby forming field oxides having thinner portions on the perimeter of said field oxides extending under said silicon nitride layer;

removing said silicon nitride layer and said pad oxide layer by wet etching;

forming a sacrificial oxide layer by thermal oxidation in said openings on said silicon substrate and removing said sacrificial oxide layer by wet etching;

depositing a conformal insulating layer on said substrate having said field oxides;

anisotropically plasma etching back said insulating layer to said substrate leaving sidewall portions of said insulating layer on said thinner portions of said field oxides thereby modifying the shape of said field oxides;

forming a thermal oxide implant layer on said device areas;

forming a well photoresist implant mask and forming in said device areas doped wells by ion implantation;

implanting channel-stop implant regions through said field oxides and through said sidewall portions of said insulating layer, said sidewall portions of said insulating layer changing the profile of said channel-stop implant regions in said substrate;

forming deep implant regions in said substrate by ion implantation;

removing said well photoresist implant mask, and thereby completing said field oxide isolation regions having said increased threshold voltages and said reduced leakage currents.

2. The method of claim 1, wherein said pad oxide layer is formed by thermal oxidation having a thickness of between about 100 and 300 Angstroms.

3. The method of claim 1, wherein said silicon nitride layer is deposited by chemical vapor deposition to a thickness of between about 1000 and 1800 Angstroms.

4. The method of claim 1, wherein said openings in said silicon nitride layer are formed using a photoresist mask and high-density plasma etching.

5. The method of claim 1, wherein said field oxide isolation regions are formed by thermal oxidation and is grown to a thickness of between about 3000 and 5000 Angstroms.

6. The method of claim 1, wherein said sacrificial oxide layer is grown to a thickness of between about 100 and 300 Angstroms and is removed by said wet etching in a hydrofluoric acid solution to provide a contamination- and defect-free silicon surface.

7. The method of claim 1, wherein said conformal insulating layer is composed of a silicon oxide deposited by chemical vapor deposition using a reactant gas of tetraethosiloxane (TEOS).

8. The method of claim 1, wherein said conformal insulating layer is deposited to a thickness of between about 1000 and 2000 Angstroms.

9. The method of claim 1, wherein said conformal insulating layer is etched back by anisotropic plasma etching.

10. The method of claim 9, wherein said anisotropic plasma etching is carried out in a high-density plasma etcher using a gas mixture containing fluorine (F) and oxygen ($O_2$).

11. The method of claim 1, wherein said thermal oxide implant layer is formed by thermal oxidation to a thickness of between about 3000 and 5000 Angstroms.

12. The method of claim 1, wherein said channel-stop implant regions are formed by implanting boron ions ($B^{11}$) having a dose of between about 1.0 E 12 and 1.0 E 14 atoms/cm$^2$ and at an ion implant energy of between about 60 and 180 KeV.

13. A method of forming modified field oxide isolation regions on the surface of a silicon substrate with increased threshold voltages and reduced leakage currents, comprising the steps of:

forming a silicon oxide layer on said surface of said silicon substrate thereby forming a pad oxide layer;

depositing a silicon nitride layer on said pad oxide layer thereby providing an oxidation barrier layer;

patterning said silicon nitride layer and said pad oxide layer and leaving portions over device areas while providing openings in said silicon nitride layer that surround said device areas where said field oxide isolation regions are required;

thermally oxidizing said silicon substrate in said openings while said silicon nitride layer prevents oxidation of said device areas thereby forming field oxides having thinner portions on the perimeter of said field oxides extending under said silicon nitride layer;

removing said silicon nitride layer and said pad oxide layer by wet etching;

forming a sacrificial oxide layer by thermal oxidation in said openings on said silicon substrate and removing said sacrificial oxide layer by wet etching;

depositing a conformal insulating layer composed of silicon nitride on said substrate having said field oxides;

anisotropically plasma etching back said insulating layer to said substrate leaving sidewall portions of said insulating layer on said thinner portions of said field oxides thereby modifying the shape of said field oxides;

forming a thermal oxide implant layer on said device areas;

forming a well photoresist implant mask and forming in said device areas doped wells by ion implantation;

implanting channel-stop implant regions through said field oxides and through said sidewall portions of said insulating layer, said sidewall portions of said insulating layer changing the profile of said channel-stop implant regions in said substrate;

forming deep implant regions in said substrate by ion implantation;

removing said well photoresist implant mask, and thereby completing said field oxide isolation regions having said increased threshold voltages and said reduced leakage currents.

14. The method of claim 13, wherein said pad oxide layer is formed by thermal oxidation having a thickness of between about 100 and 300 Angstroms.

15. The method of claim 13, wherein said silicon nitride layer is deposited by chemical vapor deposition to a thickness of between about 1000 and 1800 Angstroms.

16. The method of claim 13, wherein said openings in said silicon nitride layer are formed using a photoresist mask and high-density plasma etching.

17. The method of claim 13, wherein said field oxide isolation regions are formed by thermal oxidation and is grown to a thickness of between about 3000 and 5000 Angstroms.

18. The method of claim 13, wherein said sacrificial oxide layer is grown to a thickness of between about 200 and 300 Angstroms and is removed by said wet etching in a hydrofluoric acid solution to provide a contamination- and defect free silicon surface.

19. The method of claim 13, wherein said conformal insulating layer is deposited by chemical vapor deposition using a reactant gas of tetraethosiloxane (TEOS).

20. The method of claim 13 wherein said conformal insulating layer is deposited to a thickness of between about 1000 and 2000 Angstroms.

21. The method of claim 13, wherein said conformal insulating layer is etched back by anisotropic plasma etching.

22. The method of claim 21, wherein said anisotropic plasma etching is carried out in a high-density plasma etcher using a gas mixture containing fluorine (F) and oxygen ($O_2$).

23. The method of claim 13, wherein said thermal oxide implant layer is formed by thermal oxidation to a thickness of between about 3000 and 5000 Angstroms.

24. The method of claim 13, wherein said channel-stop implant regions are formed by implanting boron ions ($B^{11}$) having a dose of between about 1.0 E 12 and 1.0 E 14 atoms/cm$^2$ and at an ion implant energy of between about 60 and 180 KeV.

* * * * *